(12) United States Patent
Park et al.

(10) Patent No.: US 8,575,675 B2
(45) Date of Patent: Nov. 5, 2013

(54) NONVOLATILE MEMORY DEVICE

(75) Inventors: Sun-Mi Park, Gyeonggi-do (KR);
Byung-Soo Park, Gyeonggi-do (KR);
Sang-Hyun Oh, Gyeonggi-do (KR)

(73) Assignee: Hynix Semiconductor Inc.,
Gyeonggi-do (KR)

( * ) Notice: Subject to any disclaimer, the term of this patent is extended or adjusted under 35 U.S.C. 154(b) by 90 days.

(21) Appl. No.: 13/333,693

(22) Filed: Dec. 21, 2011

(65) Prior Publication Data
US 2012/0280298 A1 Nov. 8, 2012

(30) Foreign Application Priority Data
May 4, 2011 (KR) .................. 10-2011-0042595

(51) Int. Cl.
*H01L 29/78* (2006.01)
(52) U.S. Cl.
USPC .... 257/314; 257/324; 257/326; 257/E29.262; 257/E21.21; 438/586; 438/128; 438/287; 438/288

(58) Field of Classification Search
USPC ................ 257/314, 324, 326, 331, E29.262, 257/E21.21; 438/586, 128, 287, 288; 365/185.01, 185.05, 185.06
See application file for complete search history.

(56) References Cited
U.S. PATENT DOCUMENTS 7,253,055 B2 * 8/2007 Mokhlesi et al. ............. 438/257
7,867,831 B2 * 1/2011 Shin et al. ..................... 438/128
8,203,177 B2 * 6/2012 Shin et al. ..................... 257/314

\* cited by examiner

*Primary Examiner* — Thinh T Nguyen
(74) *Attorney, Agent, or Firm* — IP & T Group LLP

(57) ABSTRACT

A nonvolatile memory device includes a first channel comprising a pair of first pillars vertically extending from a substrate and a first coupling portion positioned under the pair of first pillars and coupling the pair of first pillars, a second channel adjacent to the first channel comprising a pair of second pillars vertically extending from the substrate and a second coupling portion positioned under the pair of second pillars and coupling the pair of second pillars, a plurality of gate electrode layers and interlayer dielectric layers alternately stacked along the first and second pillar portions, and first and second trenches isolating the plurality of gate electrode layers between the pair of first pillar portions and between the pair of second pillar portions, respectively.

8 Claims, 6 Drawing Sheets

NONVOLATILE MEMORY DEVICE

CROSS-REFERENCE TO RELATED APPLICATIONS

The present application claims priority of Korean Patent Application No. 10-2011-0042595, filed on May 4, 2011, which is incorporated herein by reference in its entirety.

BACKGROUND

1. Field

Exemplary embodiments of the present invention relate to a nonvolatile memory device, and more particularly, to a three-dimensional (3D) nonvolatile memory device including a plurality of memory cells that are vertically stacked over a substrate.

2. Description of the Related Art

A nonvolatile memory device refers to a memory device that maintains stored data even though a power supply is off. A variety of nonvolatile memory devices, for example, a flash memory and so on, may be used.

Meanwhile, a two-dimensional (2D) memory device, which is formed as a single layer over a silicon substrate, may reach a limit in integration degree, and a 3D non-volatile memory device including a plurality of memory cells stacked vertically over a silicon substrate may be implemented to further increase the integration degree.

FIG. 1 is a cross-sectional view illustrating a conventional 3D non-volatile memory device.

Referring to FIG. 1, a pipe gate electrode 11 and a plurality of interlayer dielectric layers 12 and gate electrode layers 13, which are alternately stacked, are formed over a substrate (not illustrated).

A pair of channel holes is formed through the interlayer dielectric layers 12 and gate electrode layers 13. The pipe gate electrode 11 includes pipe channel holes formed therein, and the pipe channel holes couple the pair of channel holes.

A memory layer 14, a channel layer 15, and a dielectric layer 16 are sequentially formed in the channel holes and the pipe channel holes.

Meanwhile, a first trench T1 is formed between the pair of channel holes to isolate the gate electrode layers 13 for each channel hole. Furthermore, a second trench T2 is formed between channel holes, which are adjacent to each other while respectively belonging to different pairs, and isolates the gate electrode layers 13 for each string.

According to the conventional nonvolatile memory device, since the plurality of memory cells are vertically stacked, a vertical height increases. Also, the horizontal width of the uppermost parts of the channel holes or the trenches inevitably increases.

Specifically, although FIG. 1 illustrates that the channel holes or the trenches have a constant width, the width inevitably decreases from the upper part toward the lower part of the channel holes or the trenches due to a characteristic of an etching process. Therefore, when the vertical height of a nonvolatile memory device is increased, the horizontal width of the uppermost parts of channel holes or trenches should be increased. Accordingly, the horizontal area of the nonvolatile memory device inevitably increases. Thus, a structure capable of preventing the horizontal area from increasing is useful.

SUMMARY

An embodiment of the present invention is directed to a nonvolatile memory device capable of reducing a horizontal area without degrading an operation characteristic.

In accordance with an embodiment of the present invention, a nonvolatile memory device includes: a first channel comprising a pair of first pillars vertically extending from a substrate and a first coupling portion positioned under the pair of first pillars and coupling the pair of first pillars; a second channel adjacent to the first channel comprising a pair of second pillars vertically extending from the substrate and a second coupling portion positioned under the pair of second pillars and coupling the pair of second pillars; a plurality of gate electrode layers and interlayer dielectric layers alternately stacked along the first and second pillars, wherein the uppermost gate electrode layer includes a gate electrode layer for a selection transistor, and the gate electrode layers other than the uppermost gate electrode layer include gate electrode layers for memory cells; and first and second trenches isolating the plurality of gate electrode layers formed between the pair of first pillars and between the pair of second pillars, respectively, wherein the selection transistor of the first channel shares a gate electrode layer with the selection transistor of the second channel.

A method of forming a nonvolatile memory device, includes: forming a pipe gate electrode including first and second sacrifice layers buried in the pipe gate electrode over a substrate; alternately stacking a plurality of first interlayer dielectric layers and gate electrode layers over the pipe gate electrode and the sacrifice layers; selectively etching at least the plurality of interlayer dielectric layers and the gate electrode layers to form a first pair of channel holes and a second pair of channel holes, wherein a width between the first pair of channel holes and a width between the second pair of channel holes are larger than a width between a first channel hole and an adjacent second channel hole; removing the sacrifice layers to form first and second coupling regions that couple the first and second pair of channel holes, respectively; forming a first memory layer and a first channel layer on inner walls of the first and second pair of channel holes and the first and second coupling regions; and etching the plurality of interlayer dielectric layers and the gate electrode layers between the pair of channel holes to form trenches.

DETAILED DESCRIPTION

Figure 1:
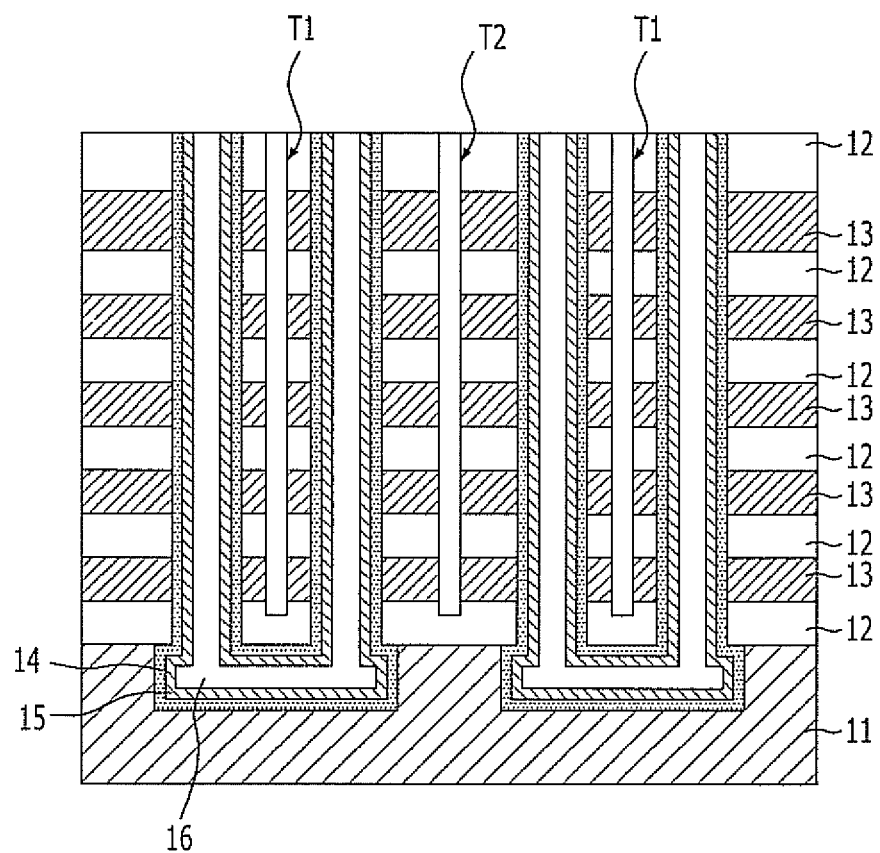
FIG. 1 is a cross-sectional view illustrating a conventional 3D non-volatile memory device.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 5:
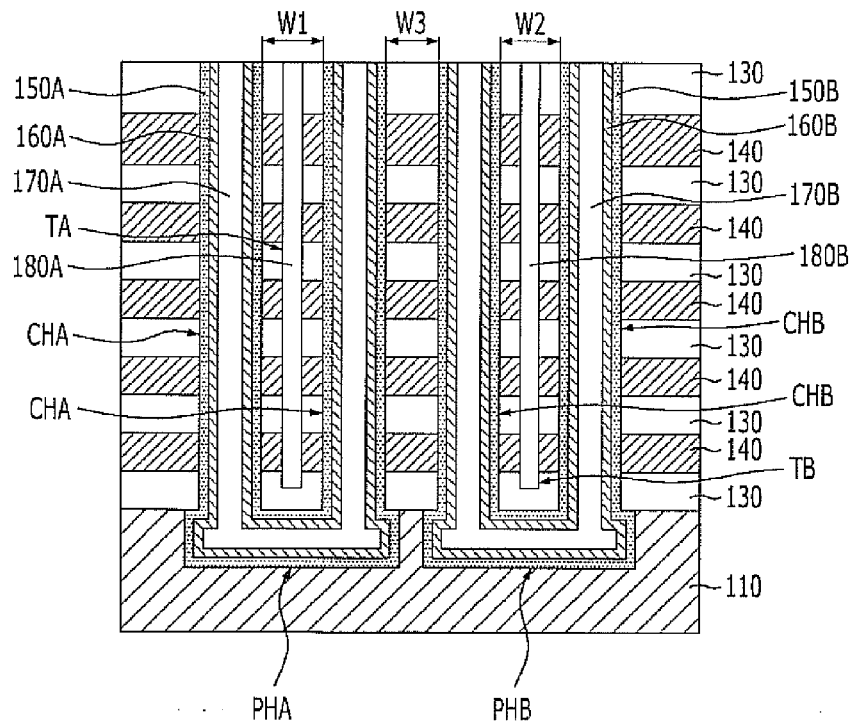
Figure 6:
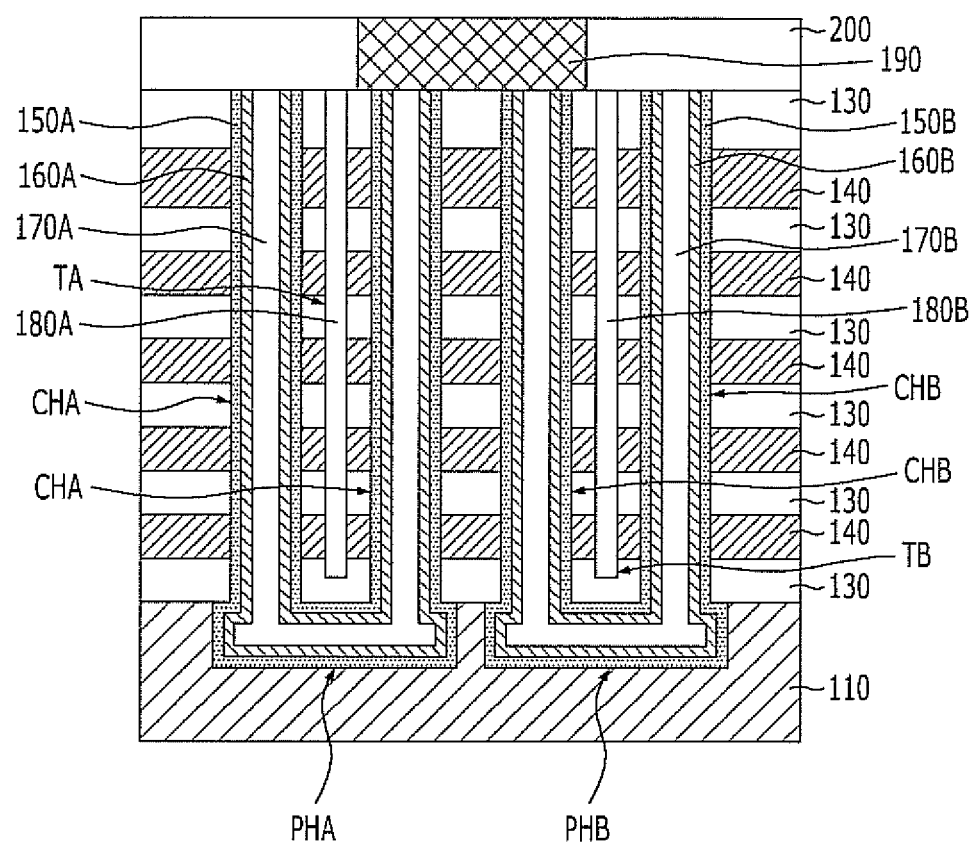
Figure 7:
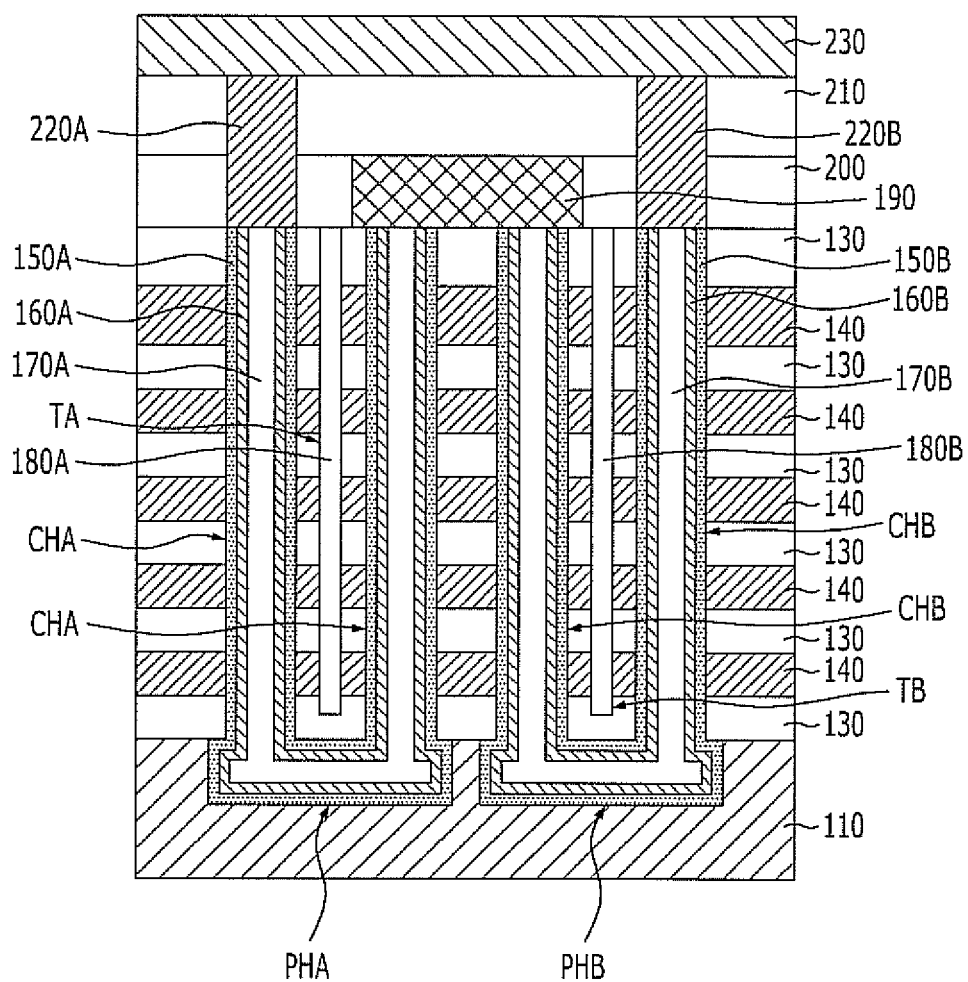

FIGS. 2 to 7 are cross-sectional views illustrating a nonvolatile memory device and a method for fabricating the same in accordance with an embodiment of the present invention. In particular, FIG. 7 is a cross-sectional view of the nonvolatile memory device in accordance with the embodiment of the present invention, and FIGS. 2 to 6 are cross-sectional views illustrating intermediate processes for fabricating the device of FIG. 7.

Figure 2:
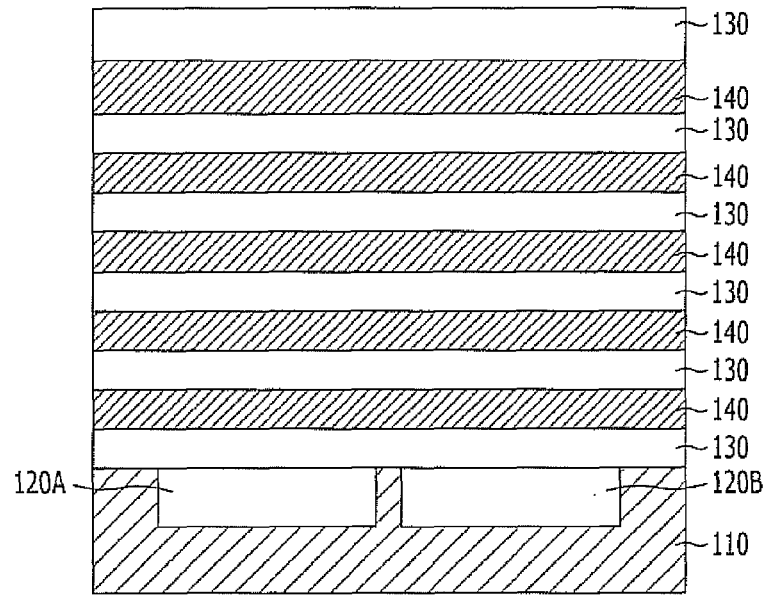
FIGS. 2 to 7 are cross-sectional views illustrating a nonvolatile memory device and a method for fabricating the same in accordance with an embodiment of the present invention.

Referring to FIG. 2, a pipe gate electrode 110 includes first and second sacrifice layers 120A and 120B buried therein and is formed over a substrate (not illustrated) to form a pipe channel transistor.

The first and second sacrifice layers 120A and 120B provide a space to form a channel of the pipe channel transistor, and the first and second sacrifice layers 120A and 120B may be formed in a bar shape that has a major axis in the cross-sectional direction (hereafter, referred to as a first direction) and a minor axis in a direction crossing the cross-section direction (hereafter, referred to as a second direction). The first and second sacrifice layers 120A and 120B may have side surfaces and a lower surface, which are surrounded by the pipe gate electrode 110, and an exposed upper surface. Furthermore, a plurality of the first and second sacrifice layers 120A and 120B may be arranged in a matrix type along the first and second directions.

The pipe gate electrode 110 including the first and second sacrifice layers 120A and 120B buried therein may be formed by the following process: a conductive layer for forming the pipe gate electrode 110, for example, impurity-doped polysilicon is deposited over the substrate, the conductive layer for forming the pipe gate is selectively etched to form a space where the first and second sacrifice layers 120A and 120B are to be buried, and the space is filled with a dielectric layer that forms the first and second sacrifice layers 120A and 120B. For example, the dielectric layer may include nitride.

A plurality of first interlayer dielectric layers 130 and gate electrode layers 140 are alternately stacked over the pipe gate electrode 110 and the first and second sacrifice layers 120A and 120B. The alternately stacked first interlayer dielectric layers 130 and gate electrode layers 140 form a stack structure.

The uppermost gate electrode layer 140 is provided to form a gate of a selection transistor, and the other gate electrodes 140 are provided to form memory cells. The gate electrode layers 140 may include impurity-doped polysilicon. Furthermore, the first interlayer dielectric layers 130 are provided to isolate the plurality of gate electrode layers 140 from each other and may include oxide.

Figure 3:
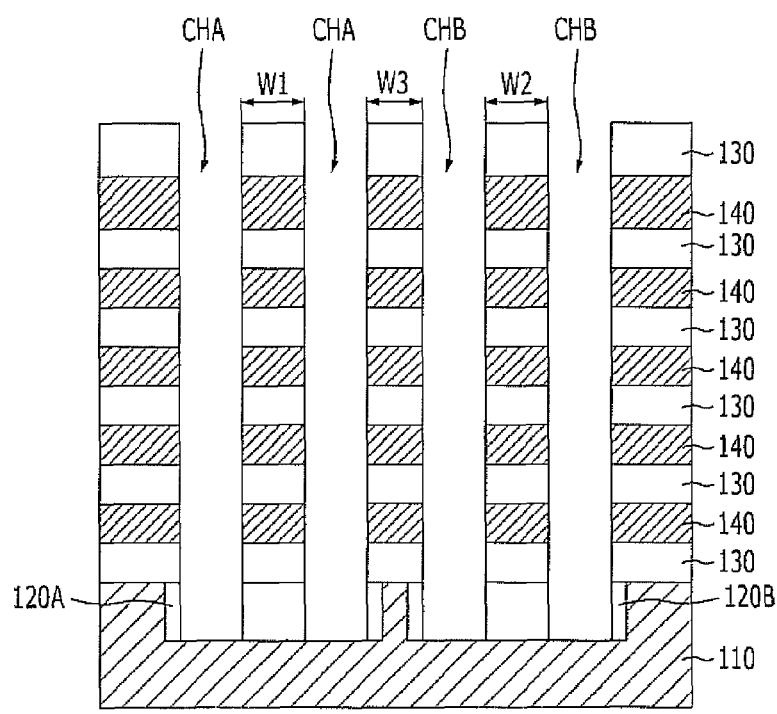

Referring to FIG. 3, the stacked structure of the first interlayer dielectric layers 130 and the gate electrode layers 140 is selectively etched to form a pair of first channel holes CHA exposing the first sacrifice layer 120A and a pair of second channel holes CHB exposing the second sacrifice layer 120B. The first and second channel holes CHA and CHB provide spaces to form memory cells and channels of selection transistors.

Here, the nonvolatile memory device in accordance with the embodiment of the present invention has a width W3 between the first and second channel holes CHA and CHB adjacent to each other, more specifically, the right first channel hole CHA and the left second channel hole CHB. Although further described below, a trench is not formed between the adjacent first and second channel holes CHA and CHB in this embodiment of the present invention. Therefore, the horizontal area of the nonvolatile memory device in accordance with the embodiment of the present invention may be reduced.

On the other hand, trenches are formed between the pair of first channel holes CHA and between the pair of second channel holes CHB (refer to FIG. 5), respectively. Therefore, a width W1 between the pair of first channel holes CHA and a width W2 between the pair of second channel holes CHB may exceed the width W3 between the adjacent first and second channel holes CHA and CHB.

During the etching process, the pair of first and second channel holes CHA and CHB may be formed to such a depth to expose at least the first and second sacrifice layers 120A and 120B. Furthermore, the first and second channel holes CHA and CHB may be formed to such a depth to expose the pipe gate electrode 110 under the first and second sacrifice layers 120A and 120B. When the first and second holes CHA and CHB are formed to a relatively large depth, the first and second sacrifice layers 120A and 120B may be exposed through side surfaces of the first and second channel holes CHA and CHB, even though a misalignment occurs between the first and second channel holes CHA and CHB and the first and second sacrifice layers 120A and 120B, respectively. Therefore, an increased process margin may be obtained.

Figure 4:
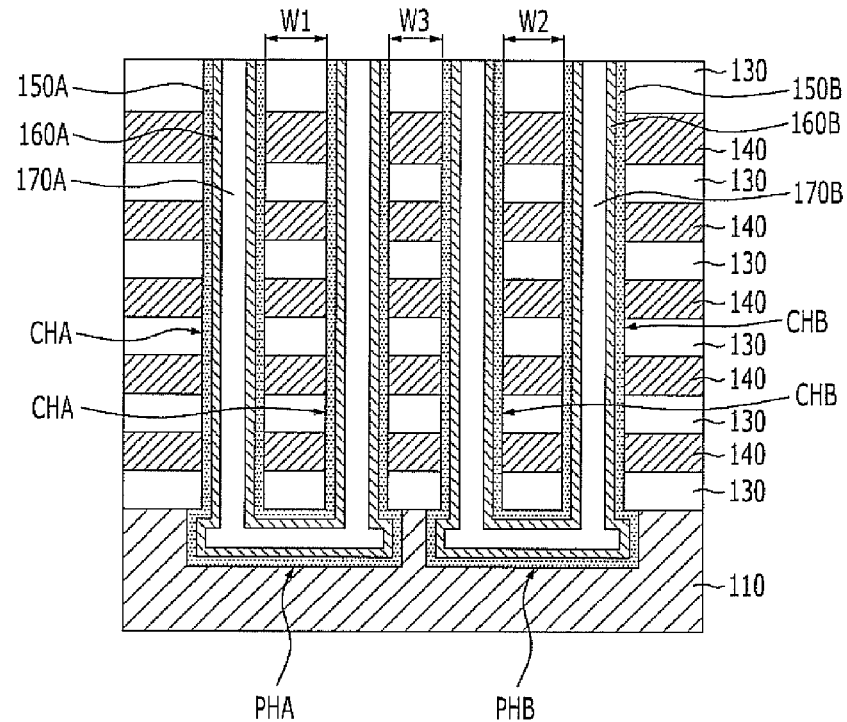

Referring to FIG. 4, the first and second sacrifice layers 120A and 120B exposed by the first and second channel holes CHA and CHB are removed to form first and second pipe channel holes PHA and PHB in the pipe gate electrode 110. As a result, the pair of first channel holes CHA is coupled through the first pipe channel hole PHA. The pair of first channel holes CHA and the first pipe channel hole form a first U-shaped channel hole. Similarly, the pair of second channel holes CHB and the second pipe channel hole PHB form a second U-shaped channel hole.

A first memory layer 150A and a first channel layer 160A are formed on the inner walls of the first U-shaped channel hole CHA and PHA, and a first oxide layer 170 is buried in a remaining space of the first U-shaped channel hole CHA and PHA after the first memory layer 150A and the first channel layer 160A are formed. Similarly, a second memory layer 150B, a second channel layer 160B, and a second oxide layer 170B are formed in the second U-shaped channel hole CHB and PHB.

Each of the first and second memory layers 150A and 150B may be formed by sequentially depositing a charge blocking layer, a charge trap layer, and a tunnel dielectric layer. The tunnel dielectric layer is used for charge tunneling and may be formed of, for example, oxide. The charge trap layer is used to trap electric charges to store data and may be formed of, for example, nitride. The charge blocking layer is used to block electric charges within the charge trap layer from moving to the outside and may be formed of, for example, oxide. More specifically, each of the first and second memory layers 150A and 150B may have a triple layer structure of oxide-nitride-oxide (ONO).

Between the gate electrode layers 140 forming memory cells, more specifically, the gate electrode layers 140 excluding the uppermost gate electrode layer 140, and the first and second channel layers 160A and 160B, the first and second memory layers 150A and 150B may trap electric charges and substantially store data, while insulating the gate electrode layers 140 from the first and second channel layers 160A and 160B. On the other hand, between the pipe gate electrode 110 forming a pipe channel transistor and the first and second channel layers 160A and 160B, the first and second memory layers 150A and 150B may serve as gate dielectric layers for insulating the pipe gate electrode 110 from the first and second channel layers 160A and 160B. Furthermore, between the uppermost gate electrode layer 140 that forms a selection transistor and the first and second channel layers 160A and 160B, the first and second memory layers 150A and 150B may serve as gate dielectric layers for electrically insulating the gate electrode layer 140 from the first and second channel layers 160A and 160B.

The first and second channel layers 160A and 160B may be formed of impurity-doped polysilicon, for example. In this embodiment of the present invention, the first and second channel layers 160A and 160B may be formed to a thickness that does not completely fill the first and second channel holes CHA and CHB. However, the present invention is not limited thereto. In another embodiment, the first and second channel layers 160A and 160B may completely fill the first and second channel holes CHA and CHB. In the completely filled channel holes embodiment, the first and second oxide layers 170A and 170B may be omitted.

The first and second channel layers 160A and 160B may be divided in pillar-shaped portions that are arranged in the first and second channel holes CHA and CHB, respectively, and vertically protrude from the substrate (hereafter, referred to as first and second pillars), and portions that are arranged in the first and second pipe channel holes PHA and PHB, respectively, and couple the pair of first pillars and the pair of second pillars, respectively (hereafter, referred to as first and second coupling portions).

Referring to FIG. 5, first and second trenches TA and TB are formed through the interlayer dielectric layers 130 and the gate electrode layers 140 between the pair of first channel holes CHA and between the pair of second channel holes CHB, respectively, such that the plurality of gate electrode layers 140 are isolated between the pair of first pillars and between the pair of second pillars, respectively. Here, the first and second trenches TA and TB may have a slit shape extending in the second direction.

The first and second trenches TA and TB are filled with dielectric materials 180A and 180B, respectively.

As a result of this process, U-shaped first and second strings are formed. The first string includes the plurality of gate electrode layers 140 formed along the pair of first pillars and is coupled by the first coupling portion. The second string includes the plurality of gate electrode layers 140 formed along the pair of second pillars and is coupled by the second coupling portion. Each of the first and second strings includes a plurality of memory cells and two selection transistors arranged at left and right upper ends of the first and second strings, respectively. As will be described below, the selection transistors arranged at the left and right upper ends of the first string may serve as a drain selection transistor and a source selection transistor, respectively, and the selection transistors arranged at the left and right upper ends of the second string may serve as a source selection transistor and a drain selection transistor, respectively.

In this embodiment of the present invention, the process of forming a trench between the adjacent first and second channel holes CHA and CHB, which is performed in the conventional nonvolatile memory device, may be omitted, and an interconnection formation process of FIGS. 6 and 7 is performed. Therefore, the gate electrode layer 140 of the source selection transistor of the first string and the gate electrode layer 140 of the source selection transistor of the second string are not isolated from each other. In other words, the first and second strings share the gates of the source selection transistors.

Referring to FIG. 6, a source line 190 is formed over the resultant structure of FIG. 5. The source line 190 serves as an interconnection coupled to the first and second pillars adjacent to each other. Over the resultant structure of FIG. 5 where the source line 190 is not formed, a second interlayer dielectric layer 200 is formed.

The source line 190 and the second interlayer dielectric layer 200 may be formed by the following method: a dielectric material for forming the second interlayer dielectric layer 200 is deposited on the entire surface of the resultant structure of FIG. 5, the dielectric material is selectively etched to provide a space where the source line 190 is to be formed, and the space is filled with a conductive material that forms the source line 190.

Referring to FIG. 7, a third interlayer dielectric layer 210 is formed over the source line 190 and the second interlayer dielectric layer 200.

First and second drain contacts 220A and 220B are formed through the third interlayer dielectric layer 210 and the second interlayer dielectric layer 200 to couple the first and second pillars that are not coupled to the source line 190, more specifically, the left first pillar and the right second pillar, respectively.

A bit line 230 is formed over the third interlayer dielectric layer 210. The bit line 230 extends in the second direction and couples to the first and second drain contacts 220A and 220B.

Although not illustrated in FIG. 7, the formation process of the bit line 230 may be performed in a similar manner to the formation process of the source line 190. More specifically, a dielectric material (not illustrated) is deposited over the third interlayer dielectric layer 210 including the first and second drain contacts 220A and 220B, and selectively etched to provide a space where the bit line 230 is to be formed, and the space is filled with a conductive material that forms the bit line 230.

Through the above-described processes, the nonvolatile memory device in accordance with the embodiment of the present invention may be formed.

The nonvolatile memory device in accordance with the embodiment of the present invention has that the features that, the width W3 between the adjacent first and second channel holes CHA and CHB is small and the horizontal area of the nonvolatile memory device decreases since a trench is not formed between the adjacent first and second channel holes CHA and CHB.

Meanwhile, since a trench is not formed between the adjacent first and second channel holes CHA and CHB in the nonvolatile memory device in accordance with the embodiment of the present invention, the gate electrode layer 140 of the source selection transistor of the first string and the gate electrode layer 140 of the source selection transistor of the second string are not isolated from each other, and the first and second strings share the gates of the source selection transistors. This configuration is illustrated in a circuit diagram of FIG. 8.

Figure 8:
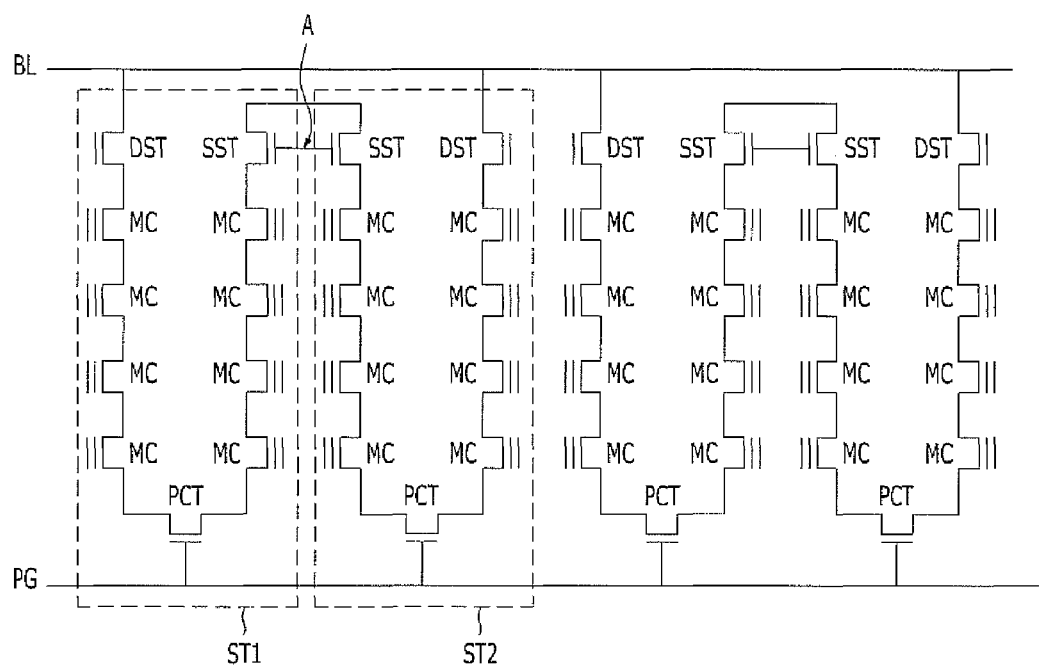
FIG. 8 is a circuit diagram illustrating the nonvolatile memory device in accordance with the embodiment of the present invention.

FIG. 8 is a circuit diagram illustrating the nonvolatile memory device in accordance with the embodiment of the present invention.

Referring to FIG. 8, one end of drain selection transistors DST of first and second strings ST1 and ST2 are coupled to a bit line BL, ends of source selection transistors SST of the first and second strings ST1 and ST2 are coupled to a source line (not illustrated), and a plurality of memory cells MC are coupled in series between the drain selection transistor DST and the source selection transistor SST of the first string ST1 and between the drain selection transistor DST and the source selection transistor SST of the second string ST2, respectively. A pipe channel transistor PCT is interposed in the middle of the plurality of memory cells MC, and coupling is controlled by the pipe channel transistor PCT.

At this time, the gate of the source selection transistor SST of the first string ST1 is coupled to the gate of the source selection transistor SST of the second string ST2 (refer to a symbol A). The first and second strings ST1 and ST2 share the gates of the source selection transistors SST because a trench is not formed between the adjacent first and second strings to reduce the horizontal area of the nonvolatile memory device.

As such, although the first and second strings ST1 and ST2 share the gates of the source selection transistors SST, a program operation or erase operation of the nonvolatile memory device in accordance with the embodiment of the present invention may be performed under the same voltage condition as in the conventional nonvolatile memory device. The same voltage conditions may be used because, in the conventional nonvolatile memory device, voltages applied to the gates of the source selection transistors SST are identical in both of an unselected string and a selected string during a program operation or erase operation.

During a read operation in the conventional nonvolatile memory device, however, different voltages, for example, a ground voltage 0V and a power supply voltage Vcc are applied to the gate of the source selection transistor SST of the unselected string and the gate of the source selection transistor SST of the selected string, respectively.

In accordance with the embodiment of the present invention, however, the same voltage is inevitably applied to the gates of the source selection transistors of the unselected string and the selected string. The same voltage is applied to both strings because the gates of the source selection transistors SST of the unselected string and the selected string are coupled to each other. More specifically, when a power supply voltage Vcc is applied to the gate of the source selection transistor SST of the selected string for a read operation, the power supply voltage Vcc is applied to the gate of the source selection transistor SST of the unselected string.

In such a case, the nonvolatile memory device may have an off leakage current of the unselected string occurring and a read disturb. However, since the drain selection transistor DST of the unselected string is turned off, an off leakage current does not occur. Furthermore, the measured read disturb was determined at an ignorable level, compared with the conventional nonvolatile memory device.

Therefore, although the gates of the source selection transistors are shared for the reduction of horizontal area in the nonvolatile memory device in accordance with the embodiment of the present invention, the operation characteristic of the nonvolatile memory device is not significantly degraded.

In accordance with the embodiment of the present invention, a horizontal area may be reduced without degrading an operation characteristic.

While the present invention has been described with respect to the specific embodiments, it will be apparent to those skilled in the art that various changes and modifications may be made without departing from the spirit and scope of the invention as defined in the following claims.

What is claimed is:
1. A nonvolatile memory device comprising:
a first channel comprising a pair of first pillars vertically extending from a substrate and a first coupling portion positioned under the pair of first pillars and coupling the pair of first pillars;
a second channel adjacent to the first channel comprising a pair of second pillars vertically extending from the substrate and a second coupling portion positioned under the pair of second pillars and coupling the pair of second pillars;
a plurality of gate electrode layers and interlayer dielectric layers alternately stacked along the first and second pillars, wherein the uppermost gate electrode layer includes a gate electrode layer for a selection transistor, and the gate electrode layers other than the uppermost gate electrode layer include gate electrode layers for memory cells; and
first and second trenches isolating the plurality of gate electrode layers formed between the pair of first pillars and between the pair of second pillars, respectively,
wherein the selection transistor of the first channel shares a gate electrode layer with the selection transistor of the second channel.

2. The nonvolatile memory device of claim 1, wherein a width between the pair of first pillars and a width between the pair of second pillars are larger than a width between a first pillar and an adjacent second pillar.

3. The nonvolatile memory device of claim 1, further comprising:
a first interconnection that couples a first pillar to an adjacent second pillar; and
a second interconnection coupled to a first pillar and second pillar that are not coupled to the first interconnection.

4. The nonvolatile memory device of claim 3, wherein the first interconnection comprises a source line, and the second interconnection comprises a bit line.

5. The nonvolatile memory device of claim 3, wherein the first interconnection is directly coupled to the first pillar and the adjacent second pillar, and
the second interconnection is coupled to first and second contacts arranged over the first pillar and the second pillar, respectively, that are not coupled to the first interconnection.

6. The nonvolatile memory device of claim 3, wherein the plurality of gate electrode layers stacked along the first pillars form a first string, the plurality of gate electrode layers stacked along the second pillars form a second string, and the first and second strings share gates of selection transistors coupled to the first interconnection.

7. The nonvolatile memory device of claim 1, further comprising a gate electrode coupled to the first and second coupling portions and configured to control the coupling of the pair of first pillars and the coupling of the pair of second pillars.

8. The nonvolatile memory device of claim 1, wherein a trench does not exist between a first pillar and an adjacent second pillar.

* * * * *